United States Patent [19]
Carlsson et al.

[11] Patent Number: 5,781,849
[45] Date of Patent: Jul. 14, 1998

[54] SPURIOUS SIGNAL REDUCTION IN RF TRANSMITTER INTEGRATED CIRCUITS

[75] Inventors: Mats Lennart Carlsson, Sundbyberg; Jan-Christian Nyström; Göran Örneving, both of Sollentuna, all of Sweden

[73] Assignee: Telefonaktiebolaget LM Ericsson, Stockholm, Sweden

[21] Appl. No.: 845,356

[22] Filed: Apr. 24, 1997

Related U.S. Application Data

[63] Continuation of Ser. No. 440,360, May 12, 1995, abandoned.

[51] Int. Cl.$^6$ ............................................. H04B 1/04
[52] U.S. Cl. ................................. 455/114; 455/48
[58] Field of Search ........................... 455/114, 115, 455/108, 109, 103, 63, 50.1, 118, 119, 310; 375/279, 308, 307

[56] References Cited

U.S. PATENT DOCUMENTS

| | | | |
|---|---|---|---|
| 3,531,722 | 9/1970 | Seibold | 455/115 |
| 3,742,496 | 6/1973 | Jero | 343/6.5 R |
| 4,086,536 | 4/1978 | Acker | 455/118 |
| 5,077,831 | 12/1991 | Weber | 455/68 |
| 5,373,265 | 12/1994 | Davis et al. | 332/151 |
| 5,463,357 | 10/1995 | Holden | 332/151 |

FOREIGN PATENT DOCUMENTS

| | | |
|---|---|---|
| 0035501 | 3/1980 | Japan. |
| 2280325 | 1/1995 | United Kingdom. |

OTHER PUBLICATIONS

*European Standard Search Report No. RS 95084* Date of Completion: 9 Nov. 1995.
Kleinschmidt, "The ARRL Handbook for the Radio Amateur", pp. 11–6, 11–7 (Jan., 1990).
Hirota et al., "A K–Band Single–Chip Transmitter", *12th Annual GAAS IC Symposium Technical Digest*, vol. 1, No. 1, pp. 275–277 (Oct., 1990).

*Primary Examiner*—Nguyen Vo
*Assistant Examiner*—Lee Nguyen
*Attorney, Agent, or Firm*—Burns, Doane, Swecker & Mathis, L.L.P.

[57] ABSTRACT

A method and system for reducing spurious signal content in transmitters is described. A lowpass or bandpass filter can be inserted after an input signal node of a transmitter to remove interfering signals generated, for example, from another input signal node of the transmitter. In this way integration of the transmitter circuitry is enhanced.

10 Claims, 2 Drawing Sheets

5,781,849

SPURIOUS SIGNAL REDUCTION IN RF TRANSMITTER INTEGRATED CIRCUITS

This application is a continuation of application Ser. No. 08/440,360, filed May. 12, 1995, now abandoned.

BACKGROUND

The present invention relates to transmitters in radiocommunication systems and more particularly to methods and systems for reducing the transmission of spurious signals.

Modern electronic equipment relies heavily on the use of clocks and oscillators for timing signals. Examples of such equipment are personal computers, household electronics and appliances (that now typically include microprocessors and digital circuits), telephone exchanges, radio equipment (including cellular telephones), and any apparatus having a power supply that utilizes switching, to name just a few.

One characteristic of oscillators and clocks is the production of unwanted emission of electromagnetic energy that can create problems not only for other nearby equipment, but also for surrounding circuits within the same piece of equipment as the oscillators and clocks. For example, within a radio receiver, an oscillator in a surrounding circuit can create interference in the radio receiver by emitting unwanted signals at a frequency where the receiver is sensitive to interference, such as the intended receive channel or at an intermediate frequency in a superheterodyne receiver. (As used in this specification, the word "interference" may refer to either radiated or conducted interference.) In many radio designs, all of the internally used oscillator frequencies are derived from a single high accuracy reference oscillator, which can produce interference at fundamental, harmonic and subharmonic frequencies of the oscillator. The mixing of these interference frequencies with the desired frequencies is referred to herein as a "spurious signal". It is theoretically impossible to detune the oscillator to eliminate this interference, although detuning can be performed such that spurious signals occur in less critical frequency bands. Thus, spurious signals continue to occur in receivers found in cellular radios and associated base stations as well as in many other radio designs.

Radio transmitters suffer from similar problems. For example, many radio transmitters generate signals at various frequencies, e.g., an intermediate frequency and a carrier frequency. When these reference frequency signals are amplitude limited, e.g., for single-side band transmission, intermodulation products of the interfering signals and the desired signal can occur from which spurious signals are created.

In electronic circuits, unwanted spurious signals are traditionally minimized by means of careful design of circuit boards, decoupling and screening, use of balanced lines, low power levels, and other commonly known design principles. However, these techniques are often inadequate at reducing the unwanted spurious signals to an acceptable level. Moreover, constant pressure to further increase the integration of component parts and minimize overall system size and power consumption makes these traditional measures less effective in controlling spurious signal generation.

Another solution is to separate those circuits which interact to generate spurious signals, i.e., the intermediate and carrier frequency circuits in a transmitter. However, integration is desirable, as mentioned above, to reduce off-chip interfaces and provide better noise levels while lowering overall power consumption.

Therefore, it is desirable to provide a method and system that can reduce spurious signal generation to an acceptable level and promote integration of circuitry that otherwise might create such spurious signals.

SUMMARY

One aspect of the present invention finds application in a transmitter having an intermediate frequency signal node and a carrier frequency signal node. Signals presented at these nodes are amplitude limited for single-side band transmission. In order to reduce interference created by the carrier frequency node with respect to the intermediate frequency node, a bandpass or lowpass filter is inserted prior to the amplitude limiting stage. In this way, interfering signals created by the carrier frequency signal node at the intermediate frequency signal node are reduced.

BRIEF DESCRIPTION OF THE DRAWINGS

The objects and advantages of the invention will be understood by reading the following detailed description in conjunction with the drawings in which.

DETAILED DESCRIPTION

Figure 1:
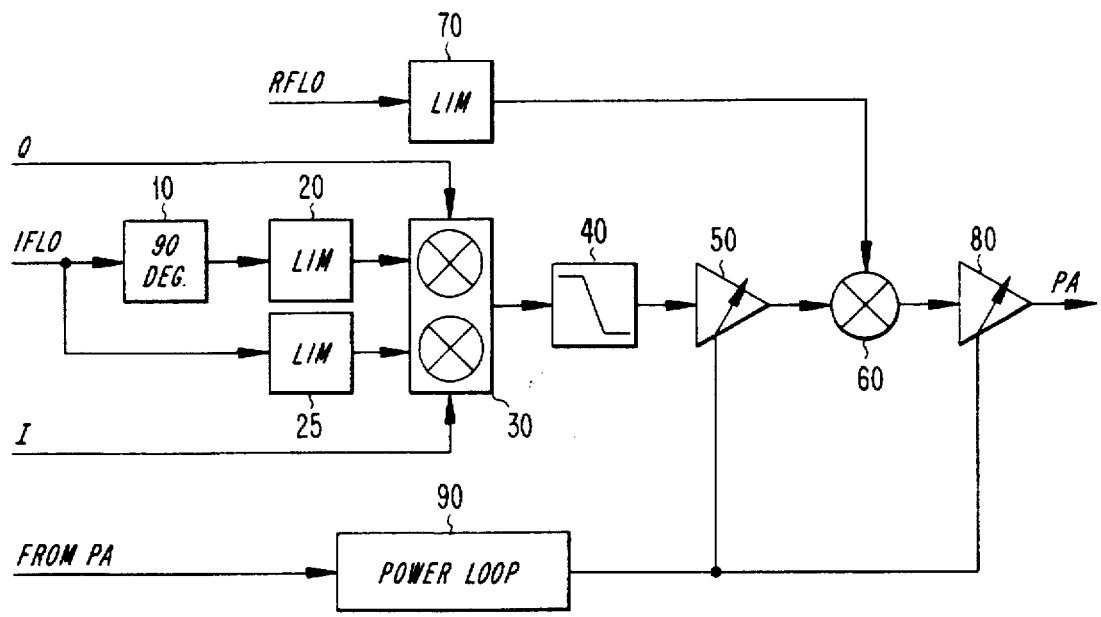
FIG. 1 is a block diagram of a conventional transmitter.

FIG. 1 illustrates a conventional transmitter chain. Therein, an intermediate frequency signal node provides an intermediate frequency signal that is phase-shifted (block 10) and amplitude-limited (block 20) prior to being input to quadrature modulator 30 along a first branch. A second branch provides an amplitude-limited (block 25) version of the intermediate signal frequency that is not phase shifted. Quadrature modulator 30 also receives the Q and I information bearing components which are modulated onto the signals provided by the first and second branches. The resultant signal is passed to lowpass filter 40 and amplified by variable amplifier 50.

The modulated signal is next upconverted at mixer 60 using the carrier frequency supplied at the carrier frequency signal node (RFLO) and amplitude limited by amplifier 70. The upconverted signal is then amplified by power amplifier 80 after which it can be coupled to an antenna (not shown) for transmission. Output power control can be provided via power feedback loop 90 to, for example, optimize system wide interference or for other reasons that are well known to those skilled in the art.

The transmitter inputs illustrated in FIG. 1 are sensitive to interfering signals which can be created, for example, by the other inputs and outputs associated with the circuit. For example, the intermediate frequency signal node (IFLO) is sensitive to, i.e., will propagate, interfering signals from the carrier frequency signal node (RFLO) including harmonics of the carrier frequency. The susceptibility of the IFLO node to such interfering signals increases as the distance between the IFLO node and the radiating nodes, e.g., RFLO, PA, etc., decreases. Thus, when the circuitry shown in FIG. 1 is integrated onto a single chip, and as the level of miniaturization increases, the problems caused by such interfering signals become more significant.

Specifically, intermodulation occurs in the nonlinear amplitude limiting stage 20 between harmonics of the intermediate frequency signal and the interfering signal. Intermodulation products that are sufficiently close in frequency to the intermediate frequency to avoid elimination by the lowpass filter 40 will then be mixed at block 60 with the amplitude-limited carrier frequency. This creates in-band spurious signals that are amplified at block 80 and transmitted.

According to exemplary embodiments of the present invention, these spurious signals can be avoided by filtering the input provided at the intermediate frequency signal node to remove the interfering signal(s) before they create intermodulation products in the limiting stage 20. A first exemplary embodiment is illustrated as FIG. 2. Therein the same reference numerals are used to denote similar elements of the transmitter circuitry, and the foregoing description of these elements is incorporated here by reference.

Figure 2:
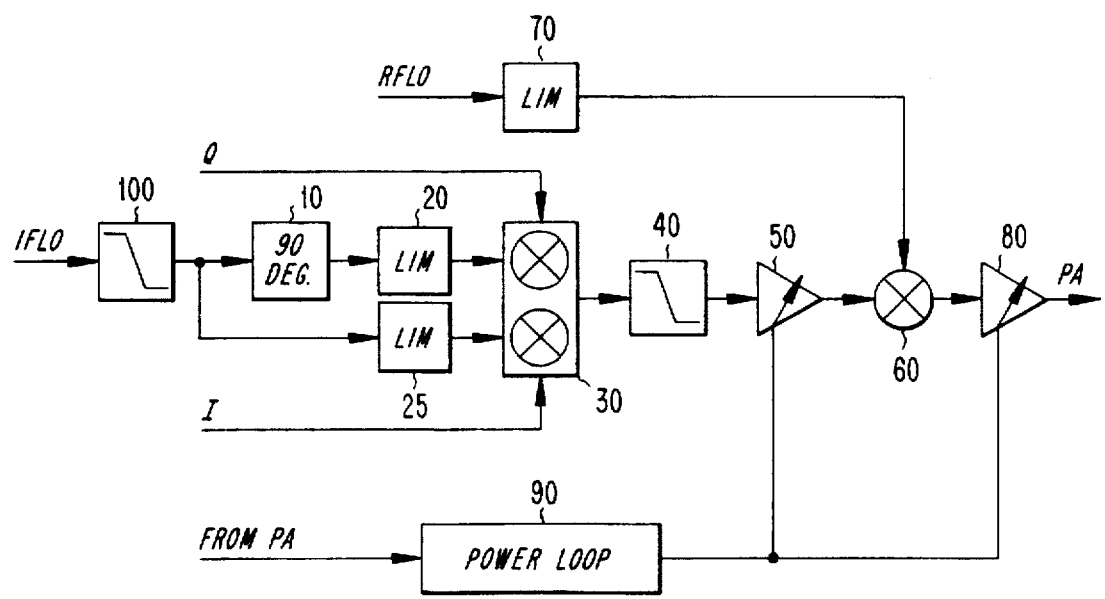
FIG. 2 is a block diagram of a transmitter according to a first exemplary embodiment of the present invention.
Figure 3:
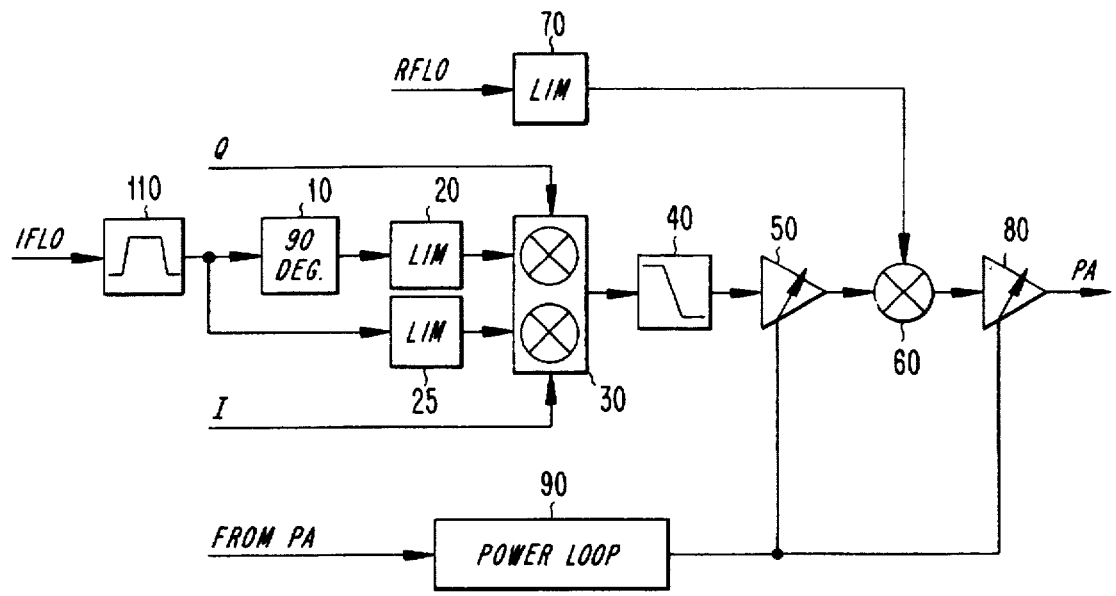
FIG. 3 is a block diagram of a transmitter according to a second exemplary embodiment of the present invention.

Note that the transmitter circuitry illustrated in FIG. 2 includes a block representation of a lowpass filter 100. Note that although the lowpass filter 100 is illustrated as being disposed upstream of phase shifter 10, those skilled in the art will appreciate that the filter 100 (or bandpass filter 10 of FIG. 3) could be disposed between phase shifter 10 and limiting stage 20, with another filter placed upstream of limiting stage 25. This lowpass filter can be tuned to the intermediate frequency to remove interfering signal(s) received at node IFLO prior to their propagation through the transmitter chain. In this way, the limiting stage 20 and 25 will receive a signal with a reduced interference content which, in turn, will reduce the magnitude of the intermodulation products. Thus, spurious signal output from power amplifier 80 is also reduced. The lowpass filter can, for example, have a cutoff frequency which is set at about 30% above the intermediate frequency. Those skilled in the art will appreciate that any suitable cutoff frequency can be used.

A lowpass filter 100 will, for example, remove interfering signals at some frequency range above the intermediate frequency to eliminate, for example, harmonics and fundamentals generated by the (higher) carrier frequency node (RFLO). However, according to another exemplary embodiment of the present invention illustrated in FIG. 3, a bandpass filter 10 can be used as an alternative to the lowpass filter 100 to remove interference both above and below the intermediate frequency. For example, data clocks are potential sources of interference which bandpass filters could be used to remove. The filter 110 can be centered about the intermediate frequency with a bandpass range of, for example, plus or minus 30% of the intermediate frequency. Those skilled in the art will appreciate that any suitable bandpass range can be used.

By providing a filter before a limiting stage in the signal path of a transmitter chain, a reduced spurious signal content can be achieved. Thus, the level of integration of such circuitry can be increased without reducing transmitter performance. Since transmitters according to the present invention are less sensitive to the layout of the circuit on a circuit board or on a semiconductor chip, the design cycle of such transmitters can be shortened.

Figure 4:
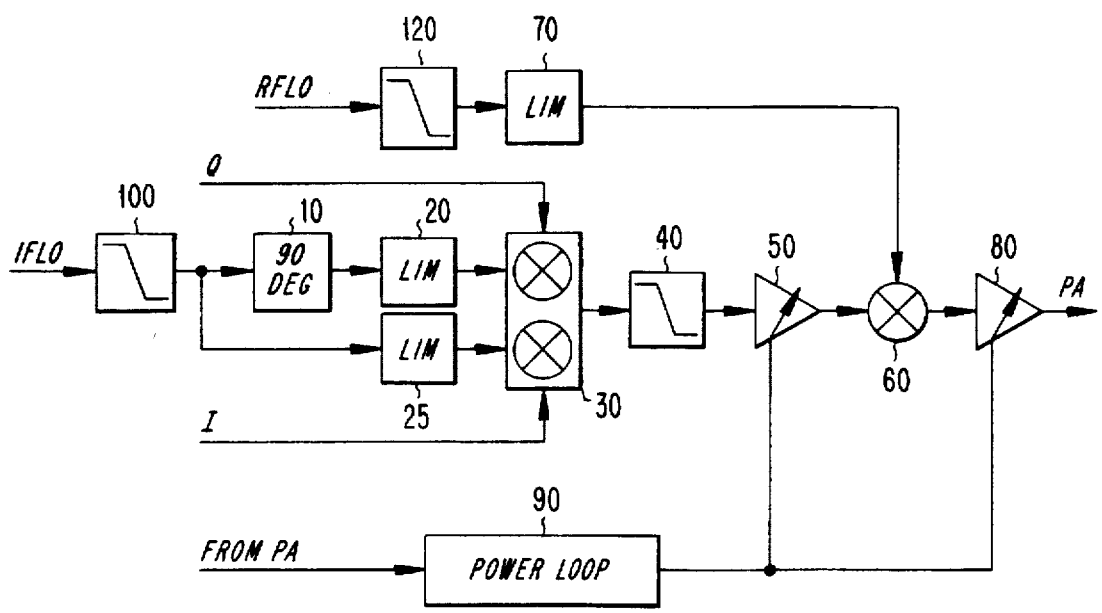
FIG. 4 is a block diagram of a transmitter according to a third exemplary embodiment of the present invention.

The invention has been described with reference to a particular embodiment. However, it will be readily apparent to those skilled in the art that it is possible to embody the invention in specific forms other than those of the preferred embodiments described above. This may be done without departing from the spirit of the invention. The preferred embodiment is merely illustrative and should not be considered restrictive in any way. For example, while the illustrative embodiments describe the provision of a filter to reduce spurious signals resulting from interfering signals propagated through an intermediate frequency signal node (IFLO), those skilled in the art will also appreciate that the present invention can be applied to reduce spurious signals propagated through other nodes, e.g., the carrier frequency node (RFLO). This embodiment is illustrated in FIG. 4 wherein a second lowpass filter 120, tuned to the carrier frequency is inserted prior to limiting stage 70. As in the previous embodiments, filter 120 could also be implemented as a bandpass filter. Moreover, the exemplary embodiment of FIG. 4 could also be modified by omitting filter 100 if interference on the intermediate frequency branch is not a concern. The scope of the invention is given by the appended claims, rather than the preceding description, and all variations and equivalents which fall within the range of the claims are intended to be embraced therein.

What is claimed is:

1. A transmitter comprising:

a carrier frequency node which presents a carrier frequency signal;

an intermediate frequency node which presents an intermediate frequency signal;

a modulator which modulates data onto said intermediate frequency signal;

a mixer which upconverts said modulated, intermediate frequency signal using said carrier frequency signal;

a first amplitude limiting stage inserted between said carrier frequency node and said mixer;

a second amplitude limiting stage inserted between said intermediate frequency node and said modulator; and a filter inserted at an input of said second amplitude limiting stage and tuned to said intermediate frequency so as to reduce spurious signals transmitted by said transmitter, wherein said carrier frequency node, said intermediate frequency node, said modulator, said mixer, said first and second amplitude limiting stages and said filter are integrated onto a single integrated circuit chip, and wherein said spurious signals result from intermodulation between said intermediate frequency signal and interfering signals emanating from nodes of said integrated circuit chip.

2. The transmitter of claim 1, wherein said filter is a bandpass filter.

3. The transmitter of claim 2, wherein said bandpass filter is centered about said intermediate frequency.

4. The transmitter of claim 1, wherein said filter is a lowpass filter.

5. The transmitter of claim 4, wherein a cutoff frequency of said lowpass filter is about 30% above said intermediate frequency.

6. Transmitter circuitry comprising:

an integrated circuit chip having a radio frequency input and an intermediate frequency input;

an amplitude limiting stage fabricated on said integrated circuit chip and disposed downstream of at least one of said radio frequency input and said intermediate frequency input; and a filter fabricated on said integrated circuit chip which filters one of said radio frequency input and said intermediate frequency input upstream of said amplitude limiting stage, wherein said filter is positioned at an input of said amplitude limiting stage so as to reduce spurious signals transmitted by said transmitter circuitry, said spurious signals resulting from intermodulation between interfering signals emanating from nodes of said integrated circuit chip.

7. The transmitter of claim 6, wherein said filter is a bandpass filter.

8. The transmitter of claim 7, wherein said bandpass filter is centered about one of said radio frequency and said intermediate frequency.

9. The transmitter of claim 6, wherein said filter is a lowpass filter.

10. The transmitter of claim 9, wherein a cutoff frequency of said lowpass filter is about 30% above one of said radio frequency and said intermediate frequency.

* * * * *